(12) United States Patent
Kumagai et al.

(10) Patent No.: US 6,462,803 B2
(45) Date of Patent: Oct. 8, 2002

(54) DISPLAY PANEL STRUCTURE WITH A REINFORCED SEALING MEMBER

(75) Inventors: Keiichiro Kumagai; Mitsuru Kuroda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/825,351

(22) Filed: Apr. 4, 2001

(65) Prior Publication Data

US 2001/0035931 A1 Nov. 1, 2001

(30) Foreign Application Priority Data

Apr. 4, 2000 (JP) ........................................ 2000-102345

(51) Int. Cl.[7] ............................................ G02F 1/1335
(52) U.S. Cl. ........................ 349/153; 349/113; 349/160; 349/60
(58) Field of Search ................................. 349/158, 160, 349/113, 59, 60

(56) References Cited

U.S. PATENT DOCUMENTS

| | | | | | |
|---|---|---|---|---|---|
| 4,043,636 | A | * | 8/1977 | Eberhardt et al. | 349/113 |
| 5,183,629 | A | * | 1/1980 | Nishimura et al. | 349/60 |
| 5,610,742 | A | * | 3/1997 | Hinata et al. | 349/153 |
| 5,721,602 | A | * | 2/1998 | Narayan et al. | 349/60 |

* cited by examiner

Primary Examiner—James A. Dudek
(74) Attorney, Agent, or Firm—Whitham, Curtis & Christofferson, P.C.

(57) ABSTRACT

In a display panel structure, a display panel is interposed between a transparent member and a metal sealing member. The edge portions of the sealing member are cemented to edge portions of the transparent member by adhesive so that the display panel is air-tightly sealed from the outside. The sealing member is integrally formed with a lattice of outwardly raised ribs for adding rigidity to the sealing member.

8 Claims, 3 Drawing Sheets

DISPLAY PANEL STRUCTURE WITH A REINFORCED SEALING MEMBER

BACKGROUND OF THE INVENTION

1. Field of the Invention

The present invention relates generally to display panels such as liquid crystal displays or electroluminescent displays, and more specifically to a rigid display panel structure.

2. Description of the Related Art

In a conventional display panel structures a liquid crystal display panel or an organic electroluminescent (EL) display panel is held between a transparent member and a sealing member The edge portions of the sealing member are cemented to the edge portions of the transparent member by adhesive so that the display panel is air-tightly sealed from the outside. For liquid crystal displays, the sealing member is formed of glass. The EL display panel is a layered structure of an organic luminescent layer, a hole injection layer and an electron injection layer, and the sealing member for this application is glass or metal This EL display panel is cemented to the sealing member by adhesive.

With the recent advances in notebook computers, there is a general tendency towards using a thinned sealing member for the display panel structure for reducing the weight of the portable computers. However, the use of thin sealing member reduces the mechanical strength of the display panel structure Japanese Patent Publication Hei 9-305125 discloses a display panel structure. In the disclosed patent publication, a metal frame structure is provided between the transparent member and the sealing member to ensure the mechanical rigidity of the display panel structure. However, the prior art adds an extra complexity to the display panel structure.

SUMMARY OF THE INVENTION

It is therefore an object of the present invention to provide a display panel structure having a reinforced sealing member for increasing the mechanical strength of the display panel structure.

According to the present invention, there is provided a display panel structure comprising a display panel having a matrix array of display elements, the display panel having a first, major surface and a second surface opposite to the first surface, a transparent member on the first surface of the display panel, and a sealing member on the second surface of the display panel, the sealing member having edge portions establishing sealing contact with edge portions of the transparent member so that the display panel is air-tightly sealed from the outside of the structure, the sealing member having a lattice of ribs outwardly raised from the outer surface of the sealing member for strengthening the sealing member,

BRIEF DESCRIPTION OF THE DRAWINGS

The present invention will be described in detail further with reference to the following drawings, in which.

DETAILED DESCRIPTION

Figure 1:
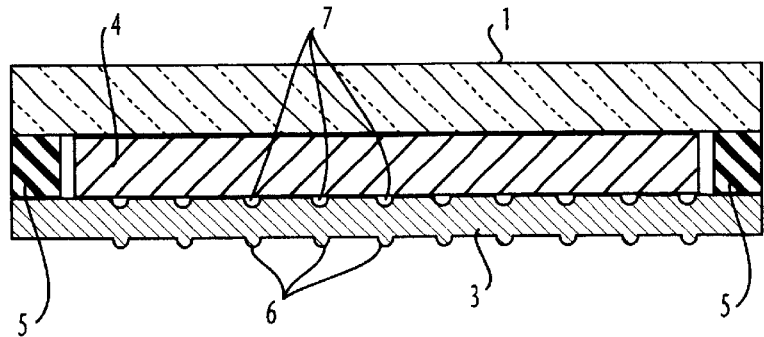
FIG. 1 is a cross-sectional side view of a display panel structure according to a first embodiment of the present invention.
Figure 2:
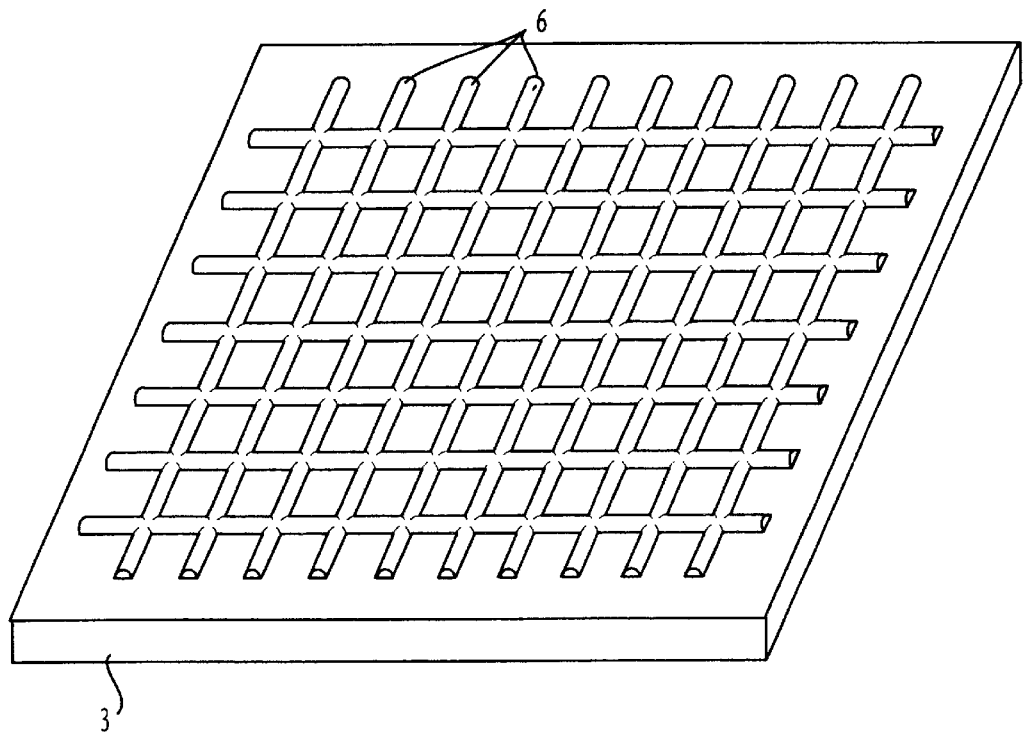
FIG. 2 is a perspective view of the display panel structure of the first embodiment of the present invention.

In FIGS. 1 and 2, a display panel structure 1 according to one embodiment of the present invention includes a transparent member 2, a metallic sealing member 3 and a display panel 4 on which a matrix array of display elements is formed. This display panel is sandwiched between the transparent member 2 and the sealing member 3 for producing a visual image on the major surface of the display panel that can be viewed from the outside through the transparent member 2. Sealing member 3 is disposed on the opposite surface of the display panel 4. Sealing member 3 has edge portions cemented to edge portions of the transparent member 2 by the use of adhesive 5 so that the display panel 4 is air-tightly sealed from the outside of the panel structure 1. Intrusion of air from the outside of the structure is prevented. Sealing member 3 is integrally formed with a lattice of ribs 6 outwardly raised from the outer surface of the sealing member 3 to increase its rigidity as well as the rigidity of the whole panel structure. Ribs 6 are formed on one surface of the metal sealing member 3 by a stamping method using a metallic mold so that the sealing member is pressed and leaves the replica of the mold on the other surface in the shape of a lattice of grooves 7 corresponding to the lattice of ribs 6.

Figure 3:
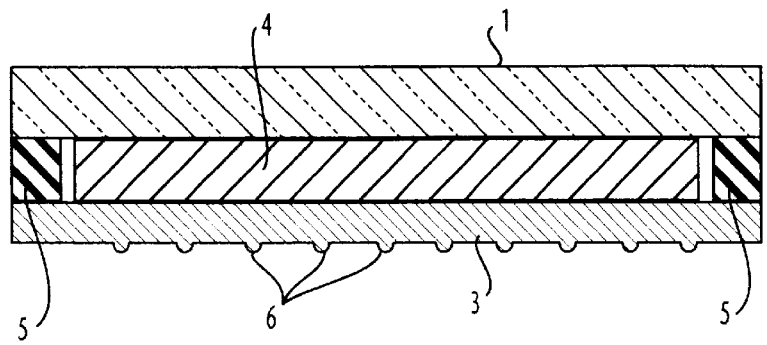
FIG. 3 is a cross-sectional side view of a display panel structure according to a second embodiment of the present invention.

A preferred embodiment of the present invention is shown in FIG. 3, in which the metallic sealing member 3 has a flat inner surface, instead of the grooved inner surface of FIG. 1. This embodiment is suitable if the display panel is a liquid crystal display panel. Sealing member 3 presents a flat plane to the display panel 4 so that the liquid of the panel is prevented from flowing out by the adhesive 5 and forms a flat panel by the sealing member 5. If the display panel structure is of a reflection type, it is preferable that the inner flat surface of the sealing member 3 be mirror-polished so that it reflects light rays off to the transparent member 2.

Figure 4:
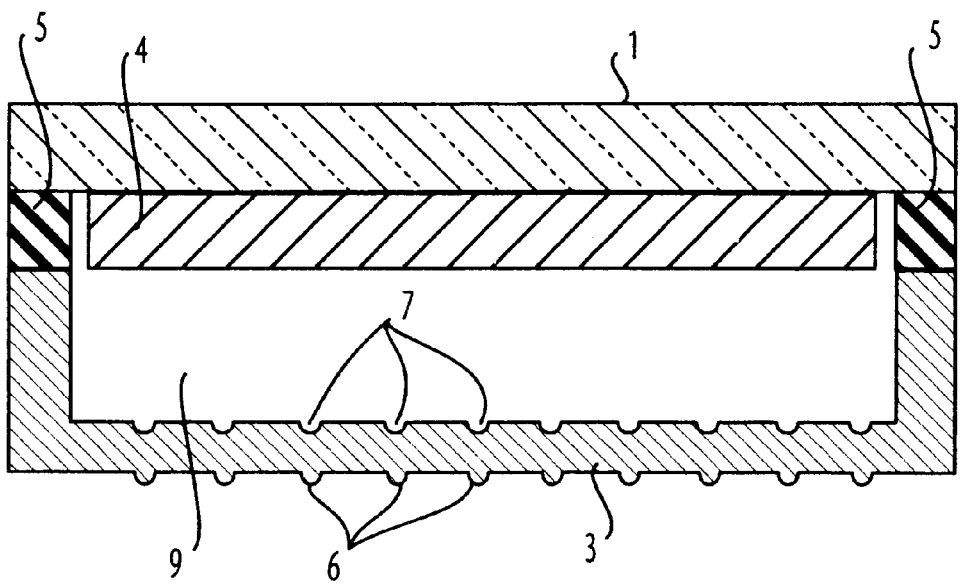
FIG. 4 is a cross-sectional side view of a display panel structure according to a third embodiment of the present invention.

A further modification of the present invention is shown in FIG. 4. This modification is suitable for applications in which the display panel 4 is an organic electroluminescent (EL) panel, In this modification, a chamber 9 is formed within the display panel structure between the EL display panel 4 and the reinforced sealing member 3. This chamber is filled with inert gas to protect the organic EL panel from vapor and oxygen present in the outside of the panel structure 1.

Figure 5:
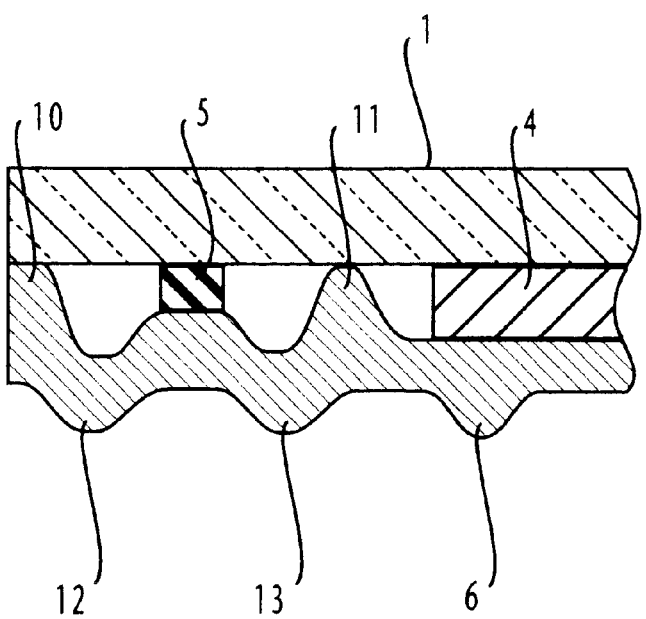
FIG. 5 is a cross-sectional side view of a display panel structure according to a fourth embodiment of the present invention.

The edge portions of the reinforced sealing member 3 are modified as shown in FIG. 5. Each of the edge portions of sealing member 3 is formed with a pair of inwardly bent parallel ribs 10 and 11 and outwardly bent raised parallel ribs 12 and 13 between the inwardly bent ribs 10 and 11. Sealing member 3 is cemented to the transparent member 2 by applying adhesive 5 between the inwardly bent ribs 10 and 11 so that these ribs are brought into contact with the transparent member 2. This arrangement prevents the adhesive 5 from flowing towards the display panel 4 or out of the structure 1.

Figure 6:
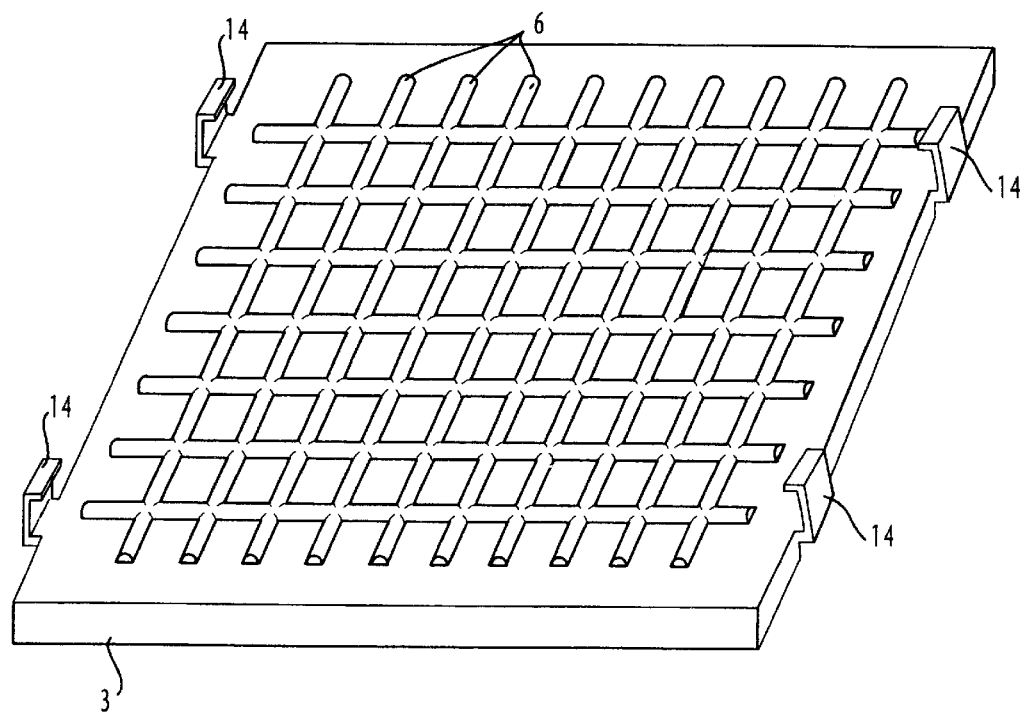
FIG. 6 is a perspective view of a modified sealing member of the present invention.
Figure 7:
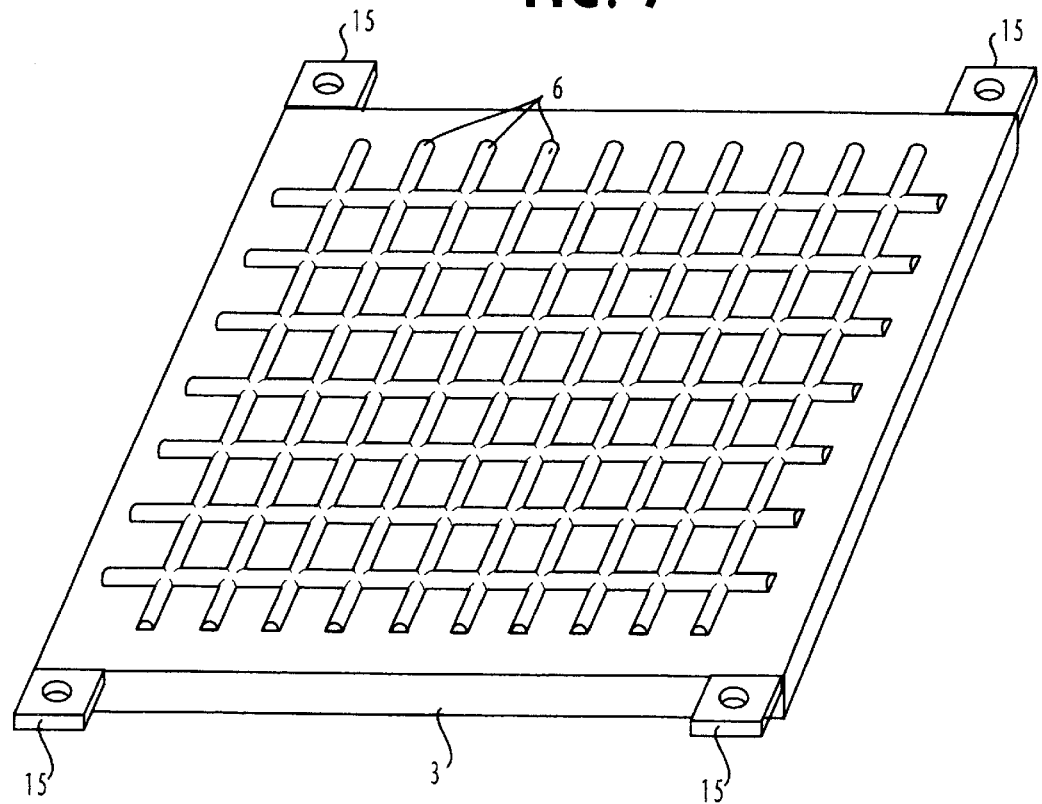
FIG. 7 is a perspective view of the sealing member of an alternative embodiment of FIG. 6.

As illustrated in FIG. 6, the reinforced sealing member 3 may be formed with a pair of hooks 14 on each of its two edge portions for attaching the display panel structure 1 to an external structure such as an electronic apparatus or a circuit board. Since the usual practice is to use a separate frame for attaching the display panel structure to the external structure, He use of the hooks 14 eliminates the use of such separate frames. Alternatively, as shown in FIG. 7, the reinforced sealing member 3 may be formed with a fixing member 15 at each corner portion. Each fixing member 15 has a hole 16 for attaching the display panel structure to an external structure with the use of screws.

What is claimed is:

1. A display panel structure comprising:

a display panel having a matrix array of display elements, said display panel having a first, major surface and a second surface opposite to the first surface;

a transparent member on the first surface of said display panel; and a sealing member on the second surface of said display panel, the sealing member having edge portions establishing sealing contact with edge portions of said transparent member so that the display panel is airtightly sealed from the outside of said structure, said sealing member having a lattice of ribs outwardly raised from the outer surface of the sealing member for strengthening the sealing member.

2. The display panel structure of claim 1, wherein said sealing member is formed of metal and said lattice of ribs is integrally formed with said sealing member.

3. The display panel structure of claim 2, wherein said lattice of ribs is of a stamped structure on the outer surface of said sealing member so that the sealing member is formed with a lattice of grooves on the inner surface thereof corresponding to said lattice of ribs.

4. The display panel structure of claim 2, wherein said lattice of ribs is of a forged structure on the outer surface of said sealing member so that the sealing member has a flat inner surface which contacts with the second surface of said display panel.

5. The display panel structure of claim 2, further comprising a chamber between the second surface of said display panel and the inner surface of the sealing member, said chamber being filled inert gas.

6. The display panel structure of claim 1, wherein said edge portions of the transparent member and said edge portions of the sealing member are cemented together by adhesive, and wherein each of the edge portions of the sealing member is formed with a pair of inwardly bent ribs for establishing contact with said transparent member so that said adhesive is contained between said pair of inwardly bent ribs on each edge portion of the sealing member.

7. The display panel structure of claim 1, wherein said sealing member is formed with fixing means for fixing the display panel structure to an external structure.

8. The display panel structure of claim 6, wherein said sealing member is formed with fixing means for fixing the display panel structure to an external structure.

* * * * *